United States Patent [19]
Takahaski et al.

[11] Patent Number: 4,550,264
[45] Date of Patent: Oct. 29, 1985

[54] BOOSTING CIRCUIT
[75] Inventors: Hitoshi Takahaski, Yokohama; Satoru Yamaguchi; Hideo Nunokawa, both of Kawasaki, all of Japan
[73] Assignee: Fujitsu Limited, Kawasaki, Japan
[21] Appl. No.: 480,585
[22] Filed: Mar. 30, 1983
[30] Foreign Application Priority Data
Mar. 31, 1982 [JP] Japan .................. 57-51148
[51] Int. Cl.[4] .......................... H03K 3/57; H03K 5/02
[52] U.S. Cl. ..................... 307/264; 307/482; 307/578
[58] Field of Search ............... 307/264, 482, 578, 246
[56] References Cited
U.S. PATENT DOCUMENTS
4,176,289 11/1979 Leach et al. .................. 307/578
4,346,310 8/1982 Carter .................. 307/578

Primary Examiner—John Zazworsky
Attorney, Agent, or Firm—Staas & Halsey

[57] ABSTRACT

A boosting circuit includes a plurality of variable capacitors with controllable capacitance values in accordance with the voltage level at first and second terminals of each of the variable capicitors A plurality of first buffer circuits is located at the first terminal side, each acting to increase the voltage level at the corresponding first terminal to a first level. A single second buffer circuit located at the second terminal side cooperating commonly with the variable capacitors, to increase the voltage level at each second terminal. The first level is thus boosted to a second level which results in an output of the circuit concerned. Each variable capacitor is fabricated by a MOS transistor capacitor.

6 Claims, 6 Drawing Figures

FOLLOWING CIRCUIT

BOOSTING CIRCUIT

BACKGROUND OF THE INVENTION (1) Field of the Invention

The present invention relates to a boosting circuit, more particularly to a boosting circuit used as a multichannel input circuit.

(2) Description of the Prior Art

As is widely known, most semiconductor integrated circuits (IC's) are driven by rated driving voltage sources. For example, an IC fabricated by transistor-transistor logic (TTL) is usually driven by a rated voltage of 5 V. This does not mean, however, that each signal on the IC has a level of 5 V.

One reason for this is that the metal oxide semiconductor (MOS) transistors comprising the IC each have their own threshold voltage levels, i.e., $V_{th}$. Therefore, even if an external signal of 5 V is applied to an input of the IC, the input signal is changed to one having a reduced voltage of, for example, $(5-V_{th})$ V, when introduced inside the IC.

Such a reduction of the voltage level of signals is not serious when the signals are treated as digital signals in the IC however, when the reduction in the signals are treated as analog signals, the voltage level becomes a serious concern. For example, when input analog signals are converted into digital signals, the result would be erroneously converted digital signals lower in value than the correct value by the threshold voltage level $V_{th}$.

In any case, it is necessary to prevent a reduction in the voltage level in the IC. In the prior art, this has conventionally been done by applying a voltage higher than 5 V, i.e., $(5+\alpha)$ V to a control gate of each transfer gate forming the input circuit. This has usually been effected by a boosting circuit based on the so-called bootstrap effect.

The above-mentioned prior art boosting circuit, however, suffers from the problem that the boosting circuit requires formation of many channels. The multichannel input circuit of the IC makes realization of a highly dense IC package impossible. Also, a complicated circuit construction is needed for forming the boosting circuit.

SUMMARY OF THE INVENTION

It is an object of the present invention to overcome the above-mentioned problem.

The above object is attained by using variable capacitors for each channel, wherein each capacitance is controllable according to the voltage level applied to each of the variable capacitors.

The boosting circuit comprises first buffer circuits located at a first terminal side of each of the variable capacitors. A second single buffer circuit is provided at a second terminal side of each of the variable capacitors.

BRIEF DESCRIPTION OF THE DRAWINGS

The present invention will be more apparent from the ensuing description with reference to the accompanying drawings, wherein.

DESCRIPTION OF THE PREFERRED EMBODIMENT

Figure 1:
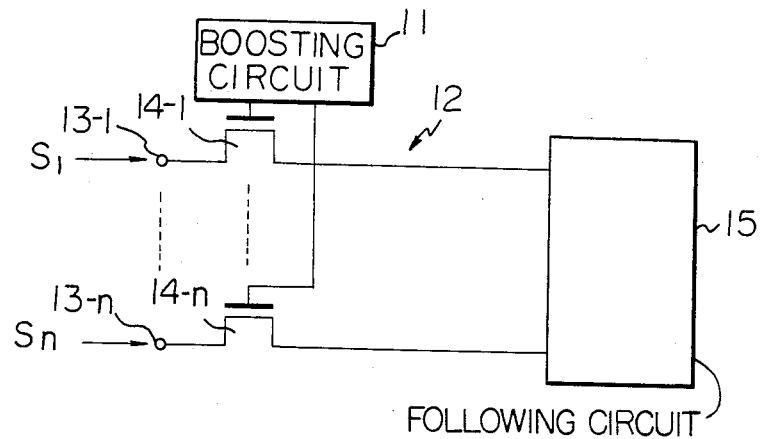
FIG. 1 is a circuit diagram of an example of an input circuit to which the present invention is adapted.

FIG. 1 is a circuit diagram of an example of an input circuit to which the present invention is adapted. In FIG. 1, reference numeral 11 represents a boosting circuit to which the present invention is applied. The boosting circuit 11 cooperates with an input circuit 12. As will be apparent hereinafter, the present invention is particularly advantageous when the input circuit 12 has a multichannel construction, as represented by numerals 13-1 through 13-n (n is positive integer greater than 1).

Each channel (13-1 through 13-n) of the multichannel is fabricated by using a transfer gate made of a MOS transistor, as represented by numerals 14-1 through 14-n. When any one of the channels is activated, the corresponding input signal $S_1$ through $S_n$ is introduced inside the IC via the then active channel. The introduced input signal is then transmitted to a following circuit 15 to be connected to the input circuit 12.

The circuit 15 can be of any type and is not relevant to the present invention. However, if it is an analog/digital converting circuit, error may occur in the converted digital signals, since the input signals $S_1$ through $S_n$ would not maintain their initial levels of voltage at each input stage of the IC. The error is caused since the transfer gates 14-1 through 14-n necessarily have threshold voltage levels $V_{th}$. Thus, the input signals $S_1$ through $S_n$, which have, for example, an inherent voltage of 5 V, would be reduced to a voltage of $(5-V_{th})$ V when reaching the input of the circuit 15.

To prevent this, a voltage exceeding the maximum voltage of 5 V, e.g., 7 V, is conventionally applied to each control gate of the transfer gates 14-1 through 14-n. This allows the supply of input signals $S_1$ through $S_n$ of a voltage level of 5 V to reach the circuit 15. Such a voltage increase at the gate is achieved by means of a boosting circuit.

Figure 2:
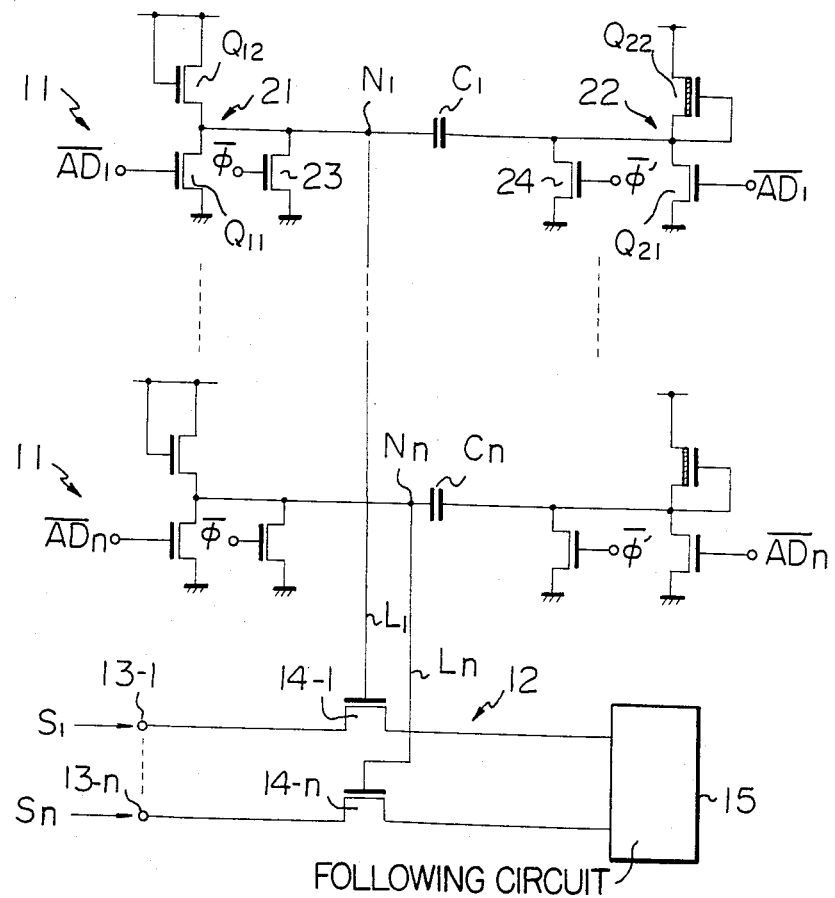
FIG. 2 is a circuit diagram of an example of a prior art boosting circuit.

FIG. 2 is a circuit diagram of an example of the prior art boosting circuit. In FIG. 2, members the same as those of FIG. 1 are represented by the same reference numerals or symbols, (same for later figures). Boosting circuits 11 of the same circuit construction are formed for each channel. The following explanation is made taking one of the boosting circuits 11 illustrated at the top of this figure as an example.

The boosting circuit 11 cooperates with the transfer gate 14-1 forming a part of the channel 13-1. To be specific, a node $N_1$ in the boosting circuit 11 is connected to the control gate of the transfer gate 14-1 by way of a line $L_1$. A node $N_1$ is also connected to a capacitor $C_1$. At the side of a first terminal (left side) of the capacitor $C_1$, a first buffer circuit 21 is formed. At the side of a second terminal (right side) of this capacitor $C_1$, a second buffer circuit 22 is formed.

Figure 3:
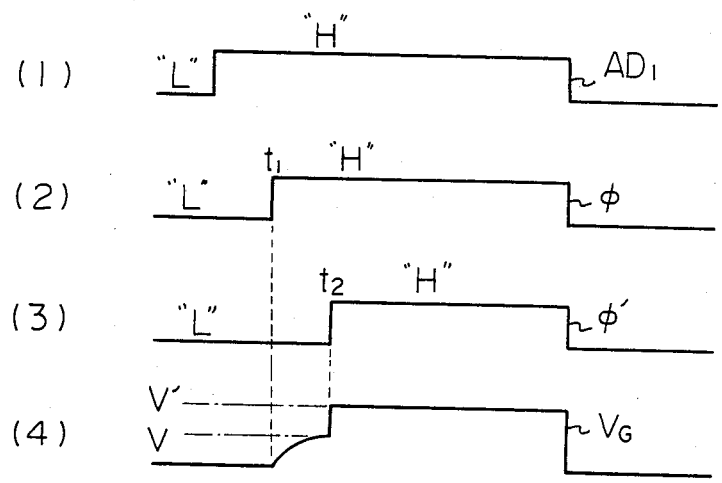
FIG. 3 depicts waveforms of signals appearing at major portions in FIG. 2.

The operation of the boosting circuit 11, when, for example, the circuit 11 shown at the top of this figure is selected by a suitable address signal and activated, is now explained. FIG. 3 depicts waveforms of signals appearing at major portions in FIG. 2. Referring to both FIGS. 2 and 3, first, an address signal $AD_1$ having a waveform shown in row (1) of FIG. 3 is supplied, as an inverted signal $\overline{AD}_1$, so as to selectively activate the boosting circuit 11. Therefore, the signal $\overline{AD}_1$ having an inverted logic level of $AD_1$ ("H" (high)), i.e., "L" (low), is applied to the first and second buffer circuits 21 and 22. Transistors $Q_{11}$ and $Q_{21}$ are turned off, and, thereby, both the first and second terminals of the capacitor $C_1$ increase to the "H" level. However, on the other hand, transistors 23 and 24 are still maintained on by timing pulse $\overline{\phi}$ and $\overline{\phi}'$, respectively. Therefore, the first and second terminals of the capacitor $C_1$ are still maintained at the "L" level.

Next, the timing pulse $\phi$ of the "H" level is given at the first time $t_1$ in row (2) of FIG. 3. The transistor 23 is turned off since it receives the timing pulse $\phi$ having an inverted logic level of $\overline{\phi}$. Soon after this, the first terminal of the capacitor $C_1$ increases in voltage toward a level of V shown in row (4) of FIG. 3, which is about 5 V. At the second time $t_2$ in row (3) of FIG. 3, the timing pulse $\phi'$ of the "H" level is given. The transistor 24 is also turned off since it receives the timing pulse $\phi'$ having an inverted logic level of $\overline{\phi}'$. Soon after this, the voltage level of the second terminal of the capacitor $C_1$ increases toward the "H" level.

At this stage, the bootstrap effect starts, so that the first terminal of the capacitor $C_1$ increases to more than the voltage level V and reaches a level of V' as shown in row (4) of FIG. 3, which is about 7 V. The voltage V' is applied via the node $N_1$ and the line $L_1$, to the control gate, as a gate voltage $V_G$, of the transfer gate 14-1. Consequently, a high voltage exceeding 5 V can be given to the control gate, as desired.

Incidentally, a transistor $Q_{12}$ of the first buffer circuit 21 is then in a cut-off state due to the high voltage of level V'. Also a transistor $Q_{22}$, preferably made of a depletion type MOS transistor, functions as a load transistor so as to fully increase the voltage level at the second terminal of the capacitor $C_1$ up to the power source level.

As understood from the prior art circuit of FIG. 2, the second buffer circuit side (right side in this figure) is relatively redundant. This results in an increase of the number of circuit elements concerned. Thus it is desirable, to realize the same function as that of the groups of second buffer circuits by means of a single second buffer circuit, not for individual channels but common to all channels.

However, a single second buffer circuit cannot easily be realized. This is because a single second buffer circuit would have to carry a very heavy load of capacitors $C_1$ through $C_n$ for all the channels at the same time, regardless which channel is in the selection state or nonselection state. The larger the number of channels, the more enormous the load of the capacitors would become. Thus, it is not practical to simplify the redundancy at the second buffer circuit side by merely employing a single second buffer circuit common to all the channels.

Figure 4:
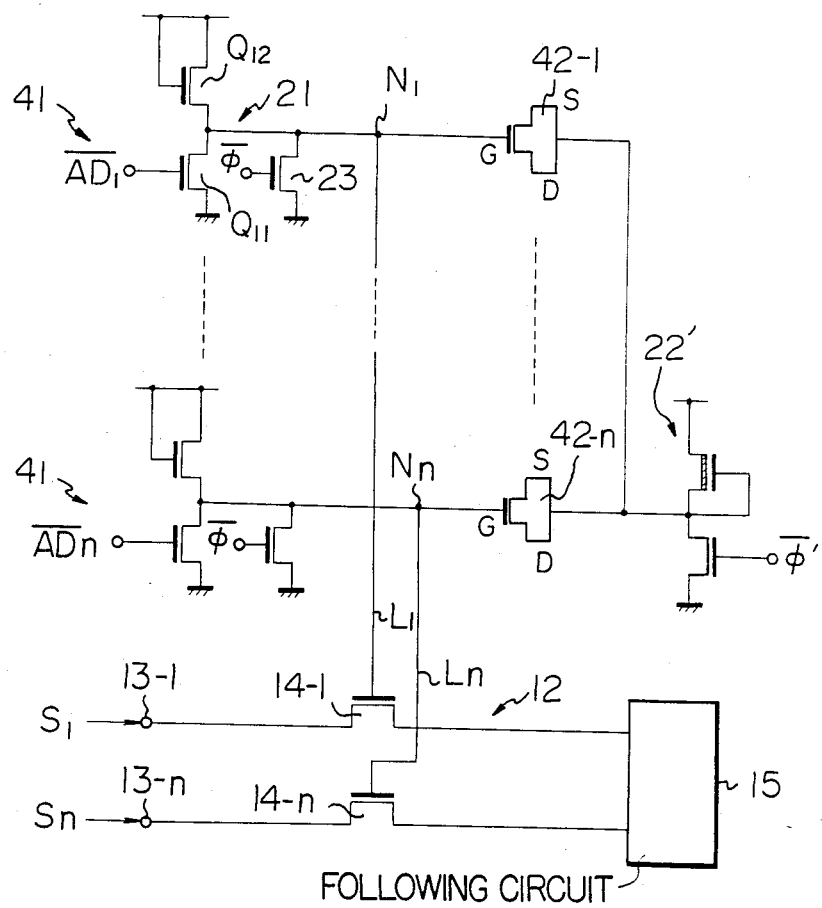
FIG. 4 is a circuit diagram of a boosting circuit according to a first embodiment of the present invention and also an ordinary input circuit cooperating therewith.

FIG. 4 is a circuit diagram of a boosting circuit according to a first embodiment of the present invention and an ordinary input circuit cooperating therewith. In FIG. 4, each of boosting circuits 41, newly proposed, is provided with a variable capacitor (instead of the prior art capacitors $C_1$ through $C_n$ in FIG. 2). The variable capacitors are preferably made of a MOS transistor capacitor, most preferably, of a depletion-type MOS transistor capacitor. In FIG. 4, the variable capacitors for the channels are illustrated as MOS transistor capacitors 42-1 through 42-n. Also, the second buffer circuits 22 for individual channels in FIG. 2 are replaced by a single second buffer circuit 22' common to all channels. In the case of the newly proposed single circuit 22', it is controlled by, instead of the aforesaid address signals $\overline{AD}_1$ through $\overline{AD}_n$ in FIG. 2, the timing pulse $\overline{\phi}'$, the waveform of which is already shown in row (3) of FIG. 3.

The feature of the present invention is the addition of MOS transistor capacitors 42-1 through 42-n. The capacitor for the selected one of the channels exhibits the largest capacitance, while the remaining capacitors for the remaining nonselected channels exhibits the least capacitance. This means that the single second buffer circuit 22' always carries one capacitance component only, as a load, created by the MOS transistor capacitor for the selected one of the channels. Accordingly, in the present invention, the capacitance load is not extremely large as in the prior art circuit of FIG. 2.

The reason for this is that when, for example, the MOS transistor capacitor 42-1 is selected for one of the channels, a so-called channel, i.e., p-channel or n-channel, is formed between a source S and a drain D of the selected MOS transistor capacitor 42-1, which results in increasing the capacitance value thereof. For other nonselected MOS transistor capacitors, such as the MOS transistor capacitor 42-n, a channel is not formed because these are in cut-off states. This decreases their capacitance values. Whether the MOS transistor capacitor is cut-off or not is determined in accordance with the relationship in the level between a voltage $V_G$ applied to the gate G and a voltage $V_{SD}$ applied to both the source S and drain D of the transistor capacitor. Under the selection state of the channel, a voltage of the "H" level is applied from the first buffer circuit 41 to the selected gate G. At the same time, a voltage of the "H" level is applied from the second buffer circuit 22' to both the source S and the drain D. In this case, an expression of $V_G \approx V_{SD}$ stands. Thus the selected MOS transistor capacitor cannot be in the cut-off state. However, under the nonselection state, the above recited expression is transformed into an expression of $V_G < V_{SD}$, in which the nonselected MOS transistor capacitor is brought into the cut-off state.

As previously mentioned, each MOS transistor capacitor is preferably made of a depletion-type MOS transistor capacitor. The reason for this is that each nonselected MOS transistor capacitor is always maintained, under the condition of $V_G \approx V_{SD}$, in the cut-off state. If each MOS transistor capacitor is made of an enhancement-type MOS transistor capacitor, the cut-off state cannot always be guaranteed under the same condition as above. Thus, the depletion-type MOS transistor capacitor is preferable in practical use.

Figure 5:
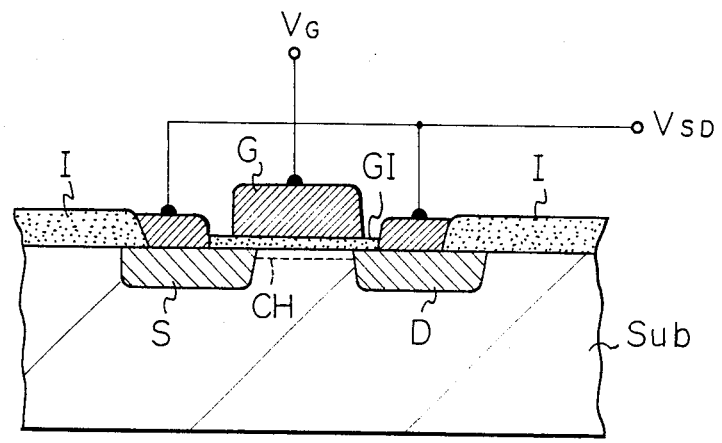
FIG. 5 is a cross-sectional view of a MOS transistor capacitor shown in FIG. 4.

FIG. 5 is a cross-sectional view of a MOS transistor capacitor shown in FIG. 4. In FIG. 5, reference symbol Sub corresponds to a substrate, I to an insulation layer, G to the gate, S to the source, and D to the drain. The voltages $V_G$ and $V_{SD}$ are applied in the manner shown in this figure. As is widely known, the MOS transistor capacitor functions as a capacitor having a dielectric material made with a gate insulation GI formed just beneath the gate G. The aforesaid channel, i.e., p-channel or n-channel, is selectively formed just beneath the gate insulation GI, as shown by reference symbol CH.

When the channel CH is formed under the condition of $V_G \approx V_{SD}$, the related capacitor exhibits a large capacitance value. In the opposite case, i.e., under the condition of $V_G < V_{SD}$, a channel CH is not created, and, therefore, a small capacitance value is obtained. Thus, the capacitance value is variable in accordance with the relationship in the level between the voltages $V_G$ and $V_{SD}$. This known fact is cleverly utilized in the present invention in establishing the boosting circuit cooperating with the multichannel input circuit. That is, the capacitance value is selectively made large for the selected MOS transistor capacitor and, simultaneously, the capacitance value is selectively made small for each nonselected MOS transistor capacitor.

Figure 6:
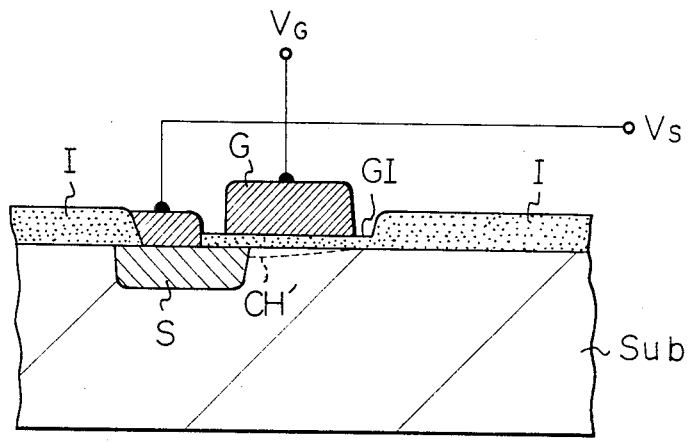
FIG. 6 is a cross-sectional view of another MOS transistor capacitor applicable to each of the capacitors 42-1 through 42-n in FIG. 4.

FIG. 6 is a cross-sectional view of another MOS transistor capacitor applicable to each of the capacitors 42-1 through 42-n in FIG. 4. The MOS transistor capacitor of FIG. 6 is identical to that of FIG. 5, except that the transistor capacitor FIG. 6 is provided with either one of the drain D or the source S (only S is shown in FIG. 6). Therefore, in case of the formation of the channel, the configuration provides a channel CH' having a slope. The voltage $V_{SD}$ in FIG. 5 should be expressed, in this case, by symbol $V_s$.

As mentioned above, the present invention enables a simply constructed boosting circuit for a multichannel input circuit.

We claim:

1. A boosting circuit for generating a boosted voltage at one of a plurality of output terminals in response to selection signals, comprising:
   a plurality of variable capacitors each having first and second terminals, said first terminals respectively connected to the output terminals, and each of said variable capacitors having a capacitance which is variable in accordance with the voltage between its first and second terminals;
   first buffer circuits, respectively, operatively connected to said variable capacitors, for selectively providing a first potential at one of said first terminals in response to the selection signals at a first timing, the first potential being higher than the potential at the other said first terminals; and
   a second buffer circuit, operatively connected to said second terminals, for boosting the potential at said second terminals at a second timing which occurs after said first timing, thereby selectively boosting the first potential at said one of said first terminals to generate the boosted voltage.

2. A boosting circuit as set forth in claim 1, wherein said variable capacitors are comprise MOS transistor capacitors having a gate, respectively, operatively connected to said first terminals, and a shorted source and drain, respectively, operatively connected to said second terminals.

3. A boosting circuit as set forth in claim 2, wherein said MOS transistor capacitors are of a depletion type.

4. A boosting circuit as set forth in claim 3, wherein said MOS transistor capacitors contain either one of a drain and a source.

5. A boosting circuit, operatively connected to receive first and second timing signals and selection signals, for generating a boosted voltage in response to the selection signals, comprising:
   first buffer circuits, one of said first buffer circuits operatively connected to receive one of the selection signals and the first timing signal, for selectively providing a first potential in response to the selection signals;
   variable capacitors having first terminals, respectively, operatively connected to said first buffer circuits, one of said variable capacitors receiving the first potential from said first buffer circuits, the first potential at said first terminal of said one of said variable capacitors being greater than the potential at the other said first terminals, and said variable capacitors having second terminals, the capacitance of each of said variable capacitors varying in accordance with the voltage between said first and second terminals; and
   a single second buffer circuit, operatively connected to said second terminals of said variable capacitors and operatively connected to receive the second timing signal, for selectively boosting the potential at one of said second terminals of one of said variable capacitors, upon receipt of the second timing signal which comes after said first timing signal, to generate the boosted voltage.

6. A boosting circuit as set forth in claim 5, wherein each of said variable capacitors comprises a MOS transistor capacitor.

* * * * *